(12) United States Patent
Ludwig et al.

(10) Patent No.: US 6,580,118 B2
(45) Date of Patent: Jun. 17, 2003

(54) NON-VOLATILE SEMICONDUCTOR MEMORY CELL HAVING A METAL OXIDE DIELECTRIC, AND METHOD FOR FABRICATING THE MEMORY CELL

(75) Inventors: Christoph Ludwig, Langebrück (DE); Martin Schrems, Eggersdorf (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/013,271

(22) Filed: Dec. 10, 2001

(65) Prior Publication Data

US 2002/0093858 A1 Jul. 18, 2002

Related U.S. Application Data

(63) Continuation of application No. PCT/DE00/01866, filed on Jun. 6, 2000.

(30) Foreign Application Priority Data

Jun. 8, 1999 (DE) .......................... 199 26 108

(51) Int. Cl.[7] .......................................... H01L 29/788
(52) U.S. Cl. ..................... 257/315; 257/314; 257/316; 438/260; 438/257
(58) Field of Search ............... 257/314–323, 257/412, 750, 751, 757; 438/260, 751, 757, 653, 656, 763, 257, 258, 261–265; 365/185.3, 185.18, 185.31

(56) References Cited

U.S. PATENT DOCUMENTS

| 4,115,914 A | | 9/1978 | Harari | |
| 5,102,814 A | * | 4/1992 | Woo | 438/263 |
| 5,268,319 A | * | 12/1993 | Harari | 257/320 |
| 5,278,087 A | * | 1/1994 | Jenq | 148/DIG. 1 |
| 5,739,566 A | | 4/1998 | Ota | |
| 5,836,772 A | | 11/1998 | Chang et al. | |
| 5,907,188 A | * | 5/1999 | Nakajima et al. | 257/412 |
| 5,998,264 A | * | 12/1999 | Wu | 438/260 |
| 6,133,150 A | * | 10/2000 | Nakajima et al. | 438/694 |

FOREIGN PATENT DOCUMENTS

JP  07 135 202  5/1995

OTHER PUBLICATIONS

Godberg, G.A.: "Novel Dielectrics for Non–Volatile Memory Devices", University Warwick, Coventry, Great Britain, 1978, abstract.

O'Connor, Kevin J. et al.: "A Novel CMOS Compatible Stacked Floating Gate Device using TiN as a Control Gate", 1997 Symposium on VLSI Technology Digest of technical Papers, pp. 61–62.

* cited by examiner

Primary Examiner—David Nelms
Assistant Examiner—Long Tran
(74) Attorney, Agent, or Firm—Laurence A. Greenberg; Werner H. Stemer; Ralph E. Locher

(57) ABSTRACT

A non-volatile semiconductor memory cell and an associated method are disclosed, in which a conventional dielectric ONO layer (10) is replaced by a very thin metal oxide layer (6) of $WO_x$ and/or $TiO_2$. The high relative dielectric constant of these materials further improves the integration density and the control voltages required for the semiconductor memory cell.

14 Claims, 5 Drawing Sheets

NON-VOLATILE SEMICONDUCTOR MEMORY CELL HAVING A METAL OXIDE DIELECTRIC, AND METHOD FOR FABRICATING THE MEMORY CELL

CROSS-REFERENCE TO RELATED APPLICATIONS

This application is a continuation of copending International Application No. PCT/DE00/01866, filed Jun. 6, 2000, which designated the United States.

BACKGROUND OF THE INVENTION

Field of the Invention

The present invention relates to a non-volatile semiconductor memory cell having a metal oxide dielectric, in particular to a memory cell for an EPROM, an EEPROM or a FLASH-EPROM memory cell, and to a method for fabricating such a memory cell.

Non-volatile semiconductor memory cells that are known, for example, from the publication by Kevin J. O'Coner et al., "A Novel CMOS Compatible Stacked Floating Gate using TiN as a Control Gate", 1997 symposium on VLSI Technology Digest of Technical Papers, pages 61–62 and that are used in EPROM, EEPROM and FLASH-EPROM memories, usually include a semiconductor substrate, an insulating tunnel oxide layer, a conductive floating-gate layer, an insulating dielectric layer and a conductive control-gate layer. To store information, charges are introduced from a channel region, which is formed in the semiconductor substrate, via the tunnel oxide layer into the floating-gate layer. Methods for introducing the charges into the floating-gate layer are, for example, injection of hot charge carriers, channel injection and Fowler-Nordheim tunneling.

Furthermore, the document Godberg, G. A.: "Novel dielectrics for non-volatile memory devices", dissertation from the University of Warwick, Coventry UK, 1978, discloses a non-volatile semiconductor memory cell that has a double dielectric as an intermediate layer and that has a dielectric layer containing a metal oxide layer, such as for example titanium oxide, tantalum pentoxide, niobium pentoxide and zirconium pentoxide. However, this arrangement does not use a conductive floating-gate layer.

The dielectric layer which lies between the floating-gate layer and the control-gate layer is of particular importance for retention of the charges stored in the floating-gate layer. This dielectric layer usually includes an "ONO" layer, i.e. a layer sequence including oxide, nitride, oxide. It is preferable to use a layer sequence of approximately 4 nm $SiO_2$, 7 nm of $Si_3N_4$ and 4 nm of $SiO_2$ for this ONO layer.

U.S. Pat. No. 5,836,772 discloses an improved ONO layer in which the nitride layer that is used is thinner than the adjoining oxide layers.

FIG. 7 is a diagrammatic band diagram for a conventional non-volatile semiconductor memory cell having an ONO layer sequence between floating-gate layer and control-gate layer. In FIG. 7, reference numeral 1s denotes a semiconductor substrate, 3s denotes an insulating tunnel oxide layer, 4s denotes a conductive floating-gate layer, which preferably consists of poly-Si, 10s denotes an insulating dielectric layer, and 7 denotes a conductive control-gate layer which once again consists of poly-Si. The dielectric layer 10s includes a $Si_3N_4$ layer 10n which lies between two $SiO_2$ layers 10o and forms the so-called ONO layer.

A drawback of using ONO layers of this type for the dielectric layer 10s is the relatively great thickness of at least 15 nm. This minimum thickness is necessary in order to ensure the required charge retention in the floating-gate layer 4s, making large-scale integration more difficult. Furthermore, this minimum thickness of approximately 15 nm has an adverse effect on the coupling factor in the non-volatile semiconductor memory cell, which is the decisive factor in determining both the read currents (and therefore the access times) and the level of the voltages that are required to erase and write the semiconductor memory cells. Therefore, the coupling factor can only be improved by enlarging the floating-gate regions, which in turn has an adverse effect on the integration density of semiconductor memory cells of this type.

U.S. Pat. No. 4,115,914, which forms a generic document, discloses a non-volatile semiconductor memory cell having a semiconductor substrate, an insulating tunnel oxide layer, a conductive floating-gate layer, an insulating dielectric layer and a conductive control-gate layer. The dielectric layer has at least one metal oxide layer including, for example, $TiO_2$.

Furthermore, Japanese Patent Application JP 07 135202 discloses a semiconductor device and an associated fabrication method in which, to level an intermediate insulation layer, a tungsten layer is deposited as a dielectric layer and is then oxidized in order to form a $WO_3$ layer.

U.S. Pat. No. 5,998,264, which is a later publication, discloses a flash memory cell and an associated fabrication method in which a dielectric, such as for example $TiO_2$, is used for the dielectric layer between the floating gate and the control electrode. In addition, a dielectric with a high dielectric constant, such as for example WN or TiN, is used for the floating-gate layer.

SUMMARY OF THE INVENTION

It is accordingly an object of the invention to provide a non-volatile semiconductor memory cell and a method for fabricating the memory cell which overcome the above-mentioned disadvantages of the prior art apparatus and methods of this general type.

In particular, it is an object of the invention to provide a non-volatile semiconductor memory cell and a corresponding fabrication method in which both an improved integration density and a reduction in the required control voltages are possible.

With the foregoing and other objects in view there is provided, in accordance with the invention, a non-volatile semiconductor memory cell, including: a semiconductor substrate; an insulating tunnel oxide layer; a conductive floating-gate layer; an insulating dielectric layer including at least one metal oxide layer and at least one $Si_3N_4$ layer enclosing the metal oxide layer; and a conductive control-gate layer. The metal oxide layer is made of a material selected from the group consisting of $WO_x$, where x=2 to 3, and $TiO_2$.

In accordance with an added feature of the invention, the floating-gate layer includes a poly-Si layer.

In accordance with an additional feature of the invention, the floating-gate layer includes a layer selected from the group consisting of a TiN layer and a WN layer.

In accordance with another feature of the invention, the floating-gate layer includes a layer selected from the group consisting of a TiN layer and a WN layer.

In accordance with a further feature of the invention, the dielectric layer has a thickness that is greater than 15 nm.

In accordance with a further added feature of the invention, the floating-gate layer has a thickness in a range from 5 nm to 50 nm.

With the foregoing and other objects in view there is also provided, in accordance with the invention, a method for fabricating a non-volatile semiconductor memory cell, that includes steps of: a) forming active regions in a semiconductor substrate; b) forming a tunnel oxide layer; c) depositing a floating-gate layer; d) depositing a metal-containing layer that includes a material selected from the group consisting of a metal and a metal compound; e) etching the metal-containing layer and the floating-gate layer; f) oxidizing the metal-containing layer and exposed side regions of the floating-gate layer to form a dielectric layer; g) depositing a control-gate layer; and h) etching the control-gate layer, the dielectric layer, and the floating-gate layer.

In accordance with an added mode of the invention, in step c) a TiN layer is deposited; and in step d) a Ti layer is deposited.

In accordance with an additional mode of the invention, in step c) a poly-Si layer is deposited; and in step d) a $WO_x$ layer is deposited, where x=2 to 3.

In accordance with another mode of the invention, in steps c) and d) a common tungsten-containing layer is deposited; and in step f) the oxidizing is performed until an oxidized partial layer of the tungsten-containing layer forms the dielectric layer and an unoxidized partial layer of the tungsten-containing layer forms the floating-gate layer.

In accordance with an added mode of the invention, there is provided a step of i) forming an insulating intermediate layer on the surface of the control-gate layer.

In particular, the use of an $Si_3N_4$ layer that encloses the metal oxide layer enables leakage currents to be reduced further and enables a higher integration density to be achieved.

Other features which are considered as characteristic for the invention are set forth in the appended claims.

Although the invention is illustrated and described herein as embodied in a non-volatile semiconductor memory cell having a metal oxide dielectric, and method for its fabrication, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
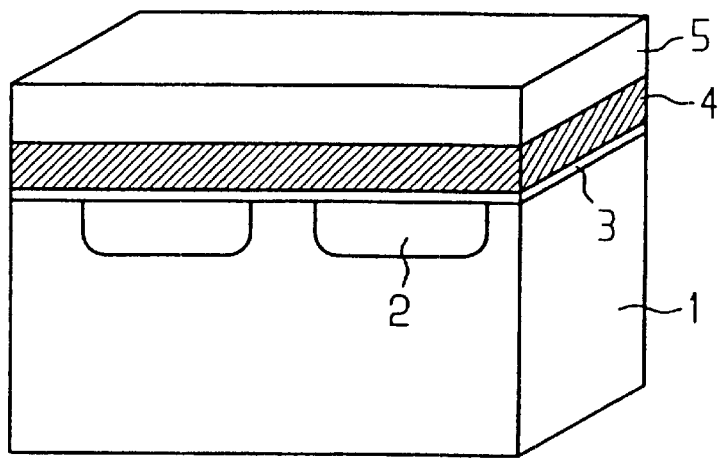
FIGS. 1a to 1f are perspective views illustrating the method steps involved in fabricating a first exemplary embodiment of a semiconductor memory cell.

Referring now to the figures of the drawing in detail and first, particularly, to FIGS. 1a to 1f thereof, there is shown perspective views illustrating the methods steps involved in fabricating a first exemplary embodiment of a semiconductor memory cell.

In the method step shown in FIG. 1a, first of all a shallow trench isolation 2 (STI process) for forming active regions is realized in a semiconductor substrate 1. The semiconductor substrate 1 preferably consists of Si, SiGe, SiC, SOI, GaAs or another III–V semiconductor. The trenches which are exposed by the STI process are then filled with a TEOS-$SiO_2$ and are planarized. Then, an insulating tunnel oxide layer 3, a conductive floating-gate layer 4 and a metal layer 5 are successively deposited on the planarized surface. The tunnel oxide layer 3 preferably consists of $SiO_2$, the floating-gate layer 4 preferably consists of TiN, and the metallic layer 5 preferably consists of Ti. The floating-gate layer 4 and the metallic layer 5 are preferably deposited using a sputtering method. The sputtering method is performed in an $N_2$ gas atmosphere. First of all, Ti is applied in order to form the TiN layer, and then in order to form the Ti layer, the supply of $N_2$ is switched off so that then only argon is present in the sputtering chamber. The layer stack shown in FIG. 1a can therefore be produced in a particularly simple way.

Figure 1B:
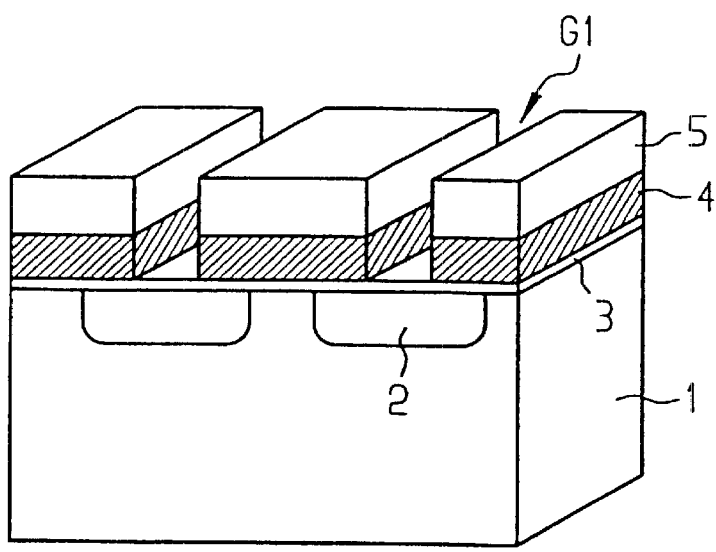

Then, in the method step shown in FIG. 1b, the metallic layer and the floating-gate layer 4 are etched down to the tunnel oxide layer 3, so that floating-gate tracks are formed. Preferably, anisotropic plasma etching using $BCl_3$ or $CF_4$ is employed to etch through trenches G1. As shown in FIG. 1b, the trenches G1 that have been etched out in this way are situated above the TEOS $SiO_2$ layer 2 formed in the semiconductor substrate.

Figure 1C:
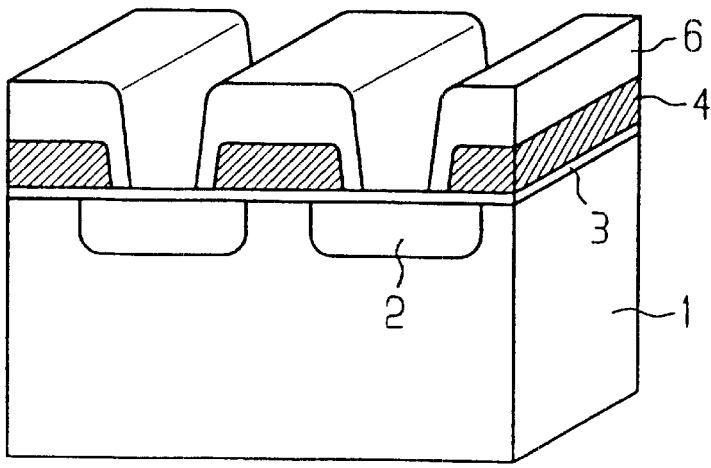

In the following method step, shown in FIG. 1c, oxidation of the metallic layer 5 is carried out. When using a Ti layer, for example, in an oxygen plasma at approximately 200° C. to 300° C. or in an RTP furnace at 700° C., the metallic layer 5 is completely converted into a metal oxide layer 6, and the exposed side regions of the floating-gate layer 4 are also partially oxidized. Depending on the process variant selected, therefore, the TiN layer is also oxidized so that the floating-gate layer (TiN layer) 4 is surrounded at the top and at the side by the metal oxide layer 6 ($TiO_2$) after this oxidation step. When using TiN for the floating-gate layer 4 and Ti for the metallic layer 5, the metallically conductive TiN layer is completely insulated after the oxidation.

Figure 1D:
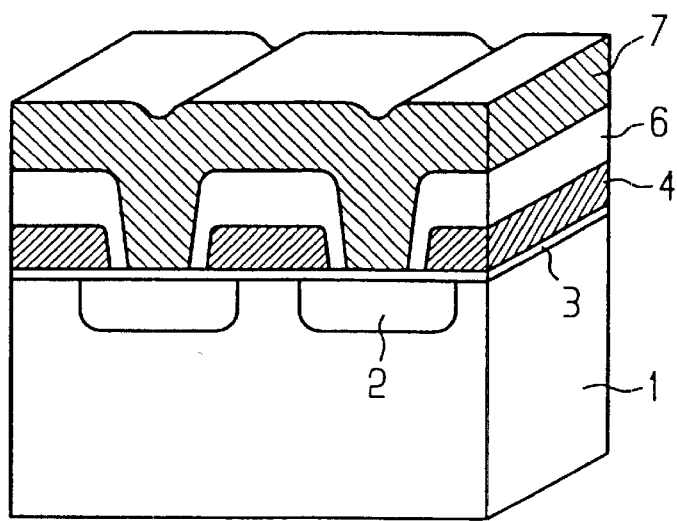

FIG. 1d shows a perspective view of the first exemplary embodiment of the semiconductor memory cell after a control-gate layer 7 has been deposited. Preferably, the control-gate layer is formed by depositing poly-Si over the entire surface using a gas mixture of silane and $H_2$ at 620° C.

Figure 1E:
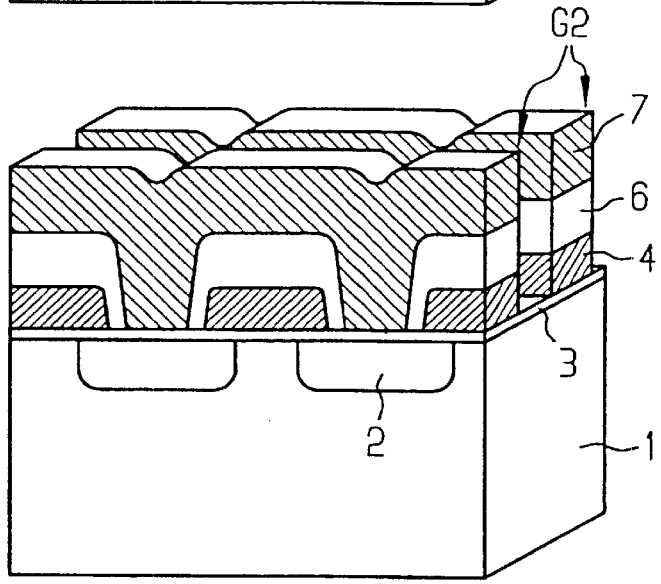

FIG. 1e shows a further method step for forming second trenches G2. The control-gate layer 7, the metal oxide layer 6 and the floating-gate layer 4 are etched in order to form control-gate tracks. This etching is preferably anisotropic reactive ion etching (RIE), using an oxide hard mask (not shown). An oxide hard mask of this type is preferably 100 nm thick and can be formed using a TEOS deposition method using Si ($C_2H_5O_4$). This oxide hard mask is anisotropically etched, for example by $CHF_3$, by $CF_4$ or by a mixture of $CHF_3$ and $CH_4$. The actual etching to form the second trenches $G_2$, with regard to the poly-Si for the control-gate layer 7, is carried out using $Cl_2$ or HBr or a mixture of these two gases; it is possible to add He and $O_2$.

This is an anisotropic etching step. To etch the metal oxide layer 6, when using $TiO_2$, by way of example a mixed gas including $CF_4$ and $O_2$ is used, with the temperature set at approximately 250° C. In order to form a plasma, the mixed gas is excited by introducing HF or by microwaves. Preferably, the ratio of $CF_2$ to $O_2$ is approximately 2% to 98%.

The fluorine which is liberated and the associated reaction between the metal oxide ($TiO_2$) and the fluorine are responsible for etching the metal oxide layer 6. Volatile metal fluorine compounds are formed, with oxygen acting as a passivator for any poly-silicon which may be present. The oxygen causes $SiO_2$ to form, the bonding energy of which (without the use of additional ion energy) is too high for it to be etched to a significant extent by the small quantity of fluorine. Therefore, the etching of the metal oxide layer 6 takes place very selectively with respect to the control-gate layer 7 (poly-silicon). As a result, as shown in FIG. 1f, a $SiO_2$ layer which surrounds the control-gate layer 7 is formed.

The etching of the floating-gate layer 4 is carried out using $BCl_3$ or using the etching method described above.

The oxide hard mask (not shown) which is required for the etching described above is removed in a subsequent spacer etching process.

Figure 1F:
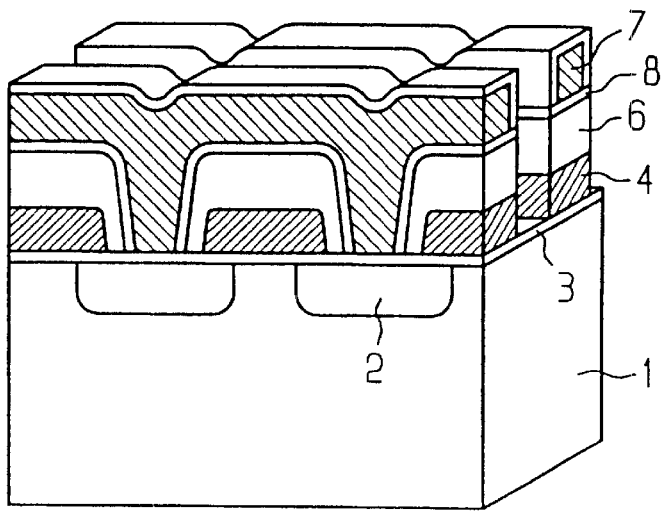

After implantation of the source and drain regions in the trenches G2, RTP annealing is carried out in a further method step shown in FIG. 1f. This RTP annealing process is used in particular to activate the donors/acceptors and to anneal out etching damage. Furthermore, when using $TiO_2$ for the metal oxide layer 6 and poly-Si for the control-gate layer 7, an $SiO_2$ intermediate layer 8 is formed at the boundary layer, which is particularly advantageous for the retention of charges in the floating-gate layer 4. The metal oxide layer 6 and the $SiO_2$ intermediate layer 8 together form a dielectric layer 10.

Figure 2:
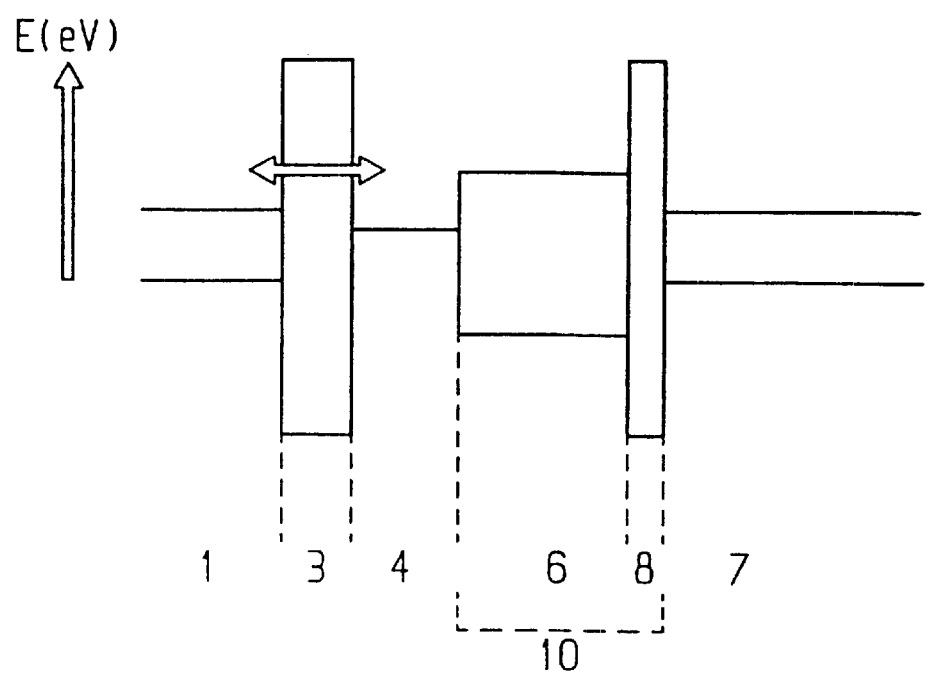
FIG. 2 is a band diagram of the first exemplary embodiment of the semiconductor memory cell.

FIG. 2 is a diagrammatic view of a band diagram of the first exemplary embodiment of the semiconductor memory cell. Reference numerals that are identical to those used in FIGS. 1a to 1f denote layers that are identical to those previously described, and consequently these parts are not described in further detail.

As shown in FIG. 2, the silicon semiconductor substrate 1 and the control-gate layer 7, which consists of poly-silicon, have an energy gap of approximately 1.1 eV. By contrast, the $SiO_2$, which is used as the tunnel oxide layer 3, has a relatively high energy gap of approximately 8 eV. Writing, reading and erasing of the charge information in the floating-gate layer 4 takes place, in particular, through the tunnel oxide layer 3 by tunneling, which is indicated by the double arrow ($\leftrightarrows$). As shown in FIG. 2, the floating-gate layer 4 includes a thin, metallically conductive TiN layer with a thickness of approximately 5 nm to 50 nm. The dielectric layer 10 includes the $SiO_2$ intermediate layer 8 and a metal oxide layer 6 of $WO_x$ and/or $TiO_2$. Unlike the ONO layer, the thickness of this dielectric layer is typically 25 nm, and is at most 50 nm. The result is that the non-volatile semiconductor memory cell has a low stack thickness, which provides an advantage for further shrink generations, and in particular, provides an advantage for the integration of embedded-flash processes.

Because of the extremely high dielectric constant of $WO_x$ and $TiO_2$ and the relatively low thickness of the dielectric layer 10, a very favorable capacitive coupling factor is also obtained. This factor results from the capacitive ratio of the capacitance $C_{FG-CG}$ to $(C_{FG-CG}+C_{FB-substrate})$, where $C_{FG-CG}$ represents the capacitance between the floating-gate layer 4 and the control-gate layer 7 and $C_{FG-Substrate}$ represents the capacitance between the floating-gate layer 4 and the source, drain and channel regions below it.

Therefore, replacing the conventional ONO layer with the dielectric layer including $WO_x$ and/or $TiO_2$ with a low thickness increases the coupling factor from 0.7 for a conventional semiconductor memory cell to approximately 0.9 to 0.95 for the inventive semiconductor memory cell. Consequently, the semiconductor memory cell can be written and erased using lower control voltages and/or within shorter times. Shorter read and write times are important in particular for use in subsequent terminals as smart cards. On the other hand, the lower control voltages result in the requirement of less space on the chip, since the functional elements (high-voltage transistors) which, for example, generate and switch the programming and erase voltages in a non-volatile memory chip, can be of smaller dimensions (lower voltages generally allow smaller dimensions for the insulating regions).

A further advantage of the higher coupling factor is that the current yield of the semiconductor memory cells is increased. A sufficient current yield is an imperative condition for rapid read access, especially at low supply voltages. Particularly, when using semiconductor memory cells in contactless chip cards, supply voltages of as little as 2 V and below are required.

Figure 3:
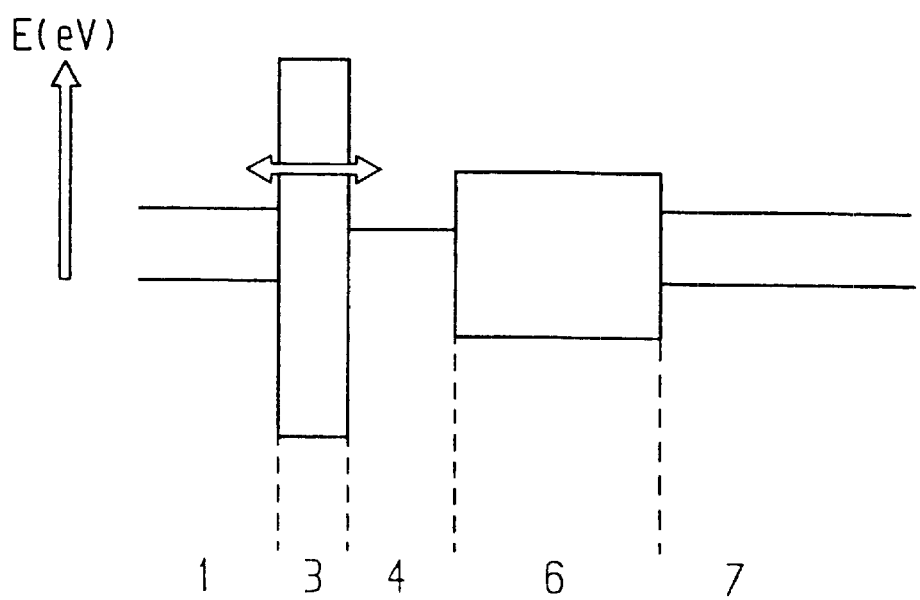
FIG. 3 is a band diagram of a second exemplary embodiment of the semiconductor memory cell.

FIG. 3 is a diagrammatic view of a band diagram of a second exemplary embodiment of the semiconductor memory cell. Reference numerals that are identical to those previously used denote layers that are identical or similar to those previously described, and consequently these layers are not described below.

Unlike the first exemplary embodiment of the non-volatile semiconductor memory cell, the semiconductor memory cell shown in FIG. 3 does not have an $SiO_2$ intermediate layer 8, and this allows the fabrication method to be further simplified. Because of the extremely favorable properties of the metal oxide layer 6, which consists of $WO_x$ and/or $TiO_2$, with regard to the retention of the charges in the floating-gate layer 4, the coupling factor is improved further with slight deterioration of the tunnel barrier.

Figure 4:
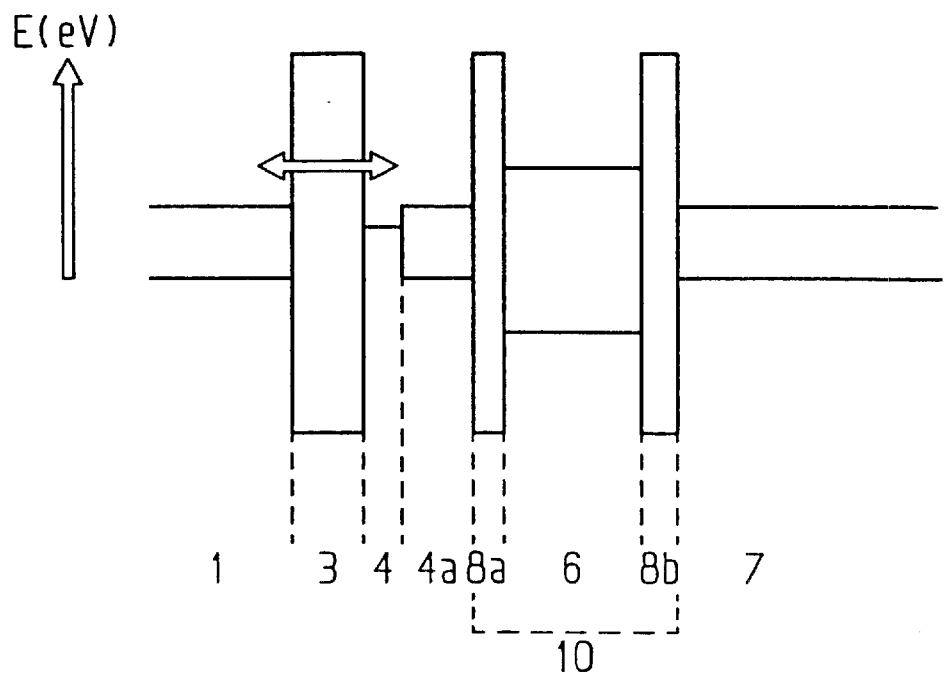
FIG. 4 is a band diagram of a third exemplary embodiment of the semiconductor memory cell.

FIG. 4 is a diagrammatic view of a band diagram of a third exemplary embodiment of the semiconductor memory cell. Reference numerals that are identical to those previously used denote layers that are identical or similar to those previously described, and consequently these layers are not described below.

Unlike the first and second exemplary embodiments of the semiconductor memory cell, the third exemplary embodiment of the semiconductor memory cell has a double layer including metal TiN 4 and poly-silicon 4a for the floating-gate layer (charge-storing layer). The use of a charge-storing double layer of this type has the advantage that in the annealing step shown in FIG. 1f, not only is an $SiO_2$ intermediate layer 8b formed at the boundary layer with the control-gate layer 7, but also a further $SiO_2$ layer 8a is automatically formed at the boundary layer with the poly-silicon layer 4a of the floating-gate layer. This is because of the diffusion of oxygen out of the metal oxide layer 6. In this way, an extremely high charge density of the dielectric layer 10 is obtained without significantly changing the method steps, charge losses caused by tunneling currents or leakage currents being further improved. In a similar manner to the exemplary embodiments described above, the metal oxide layer 6 may once again consist of $WO_x$ and/or $TiO_2$.

Figure 5:
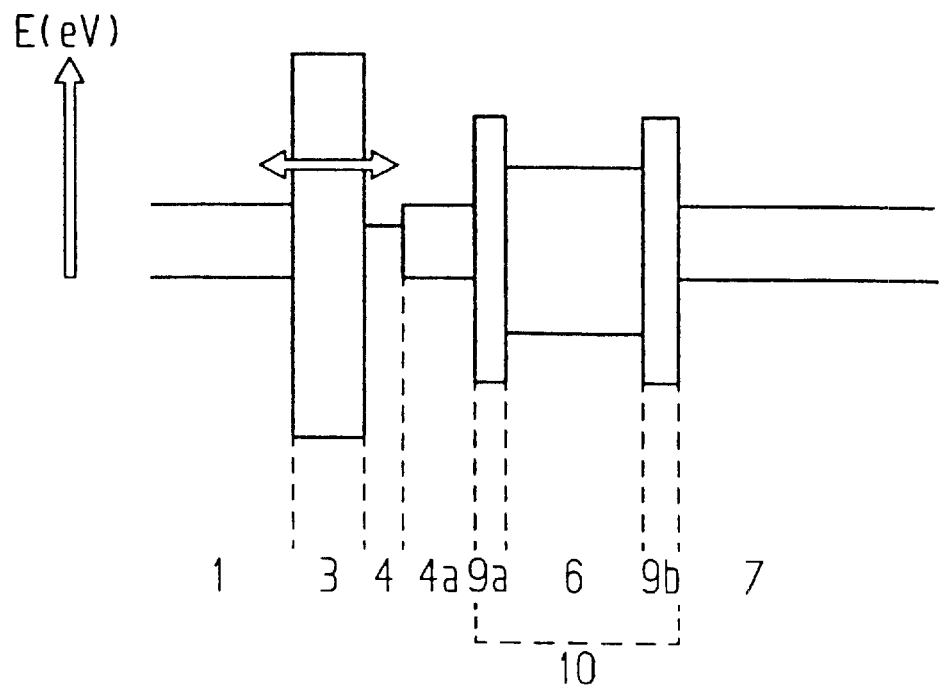
FIG. 5 is a band diagram of a fourth exemplary embodiment of the semiconductor memory cell.

FIG. 5 is a diagrammatic view of a band diagram of a fourth exemplary embodiment of the semiconductor memory cell. Reference numerals that are identical to those previously used denote layers that are identical or similar to those previously described, and consequently these layers are not described below.

Unlike the third exemplary embodiment, the fourth exemplary embodiment of the semiconductor memory cell includes the dielectric layer 10 which, in addition to the metal oxide layer 6 of $WO_x$ and/or $TiO_2$, also has in each case one nitride layer 9a and 9b of, for example, $Si_3N_4$. Although the energy gap of $Si_3N_4$ is lower than that of $SiO_2$ (approximately 5 eV), it forms an alternative to the $SiO_2$ layers 8a and 8b illustrated in FIG. 4. Particularly when control voltages for writing, reading and/or erasing charges from the floating-gate layer 4 and 4a are applied, these $Si_3N_4$ layers 9a and 9b provide advantages with regard to any leakage currents which occur.

Figure 6:
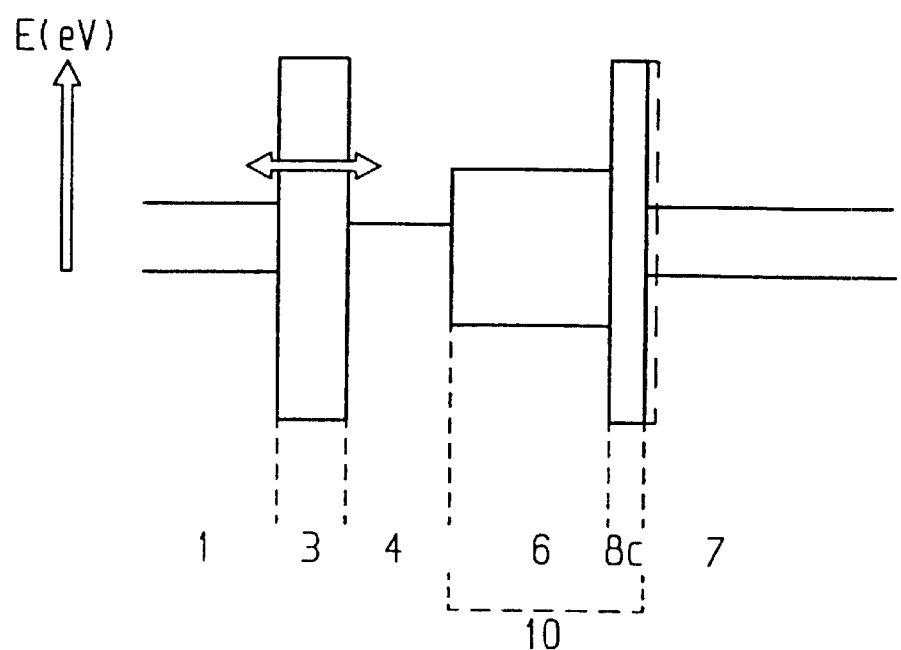
FIG. 6 is a band diagram of a fifth exemplary embodiment of the semiconductor memory cell.
Figure 7:
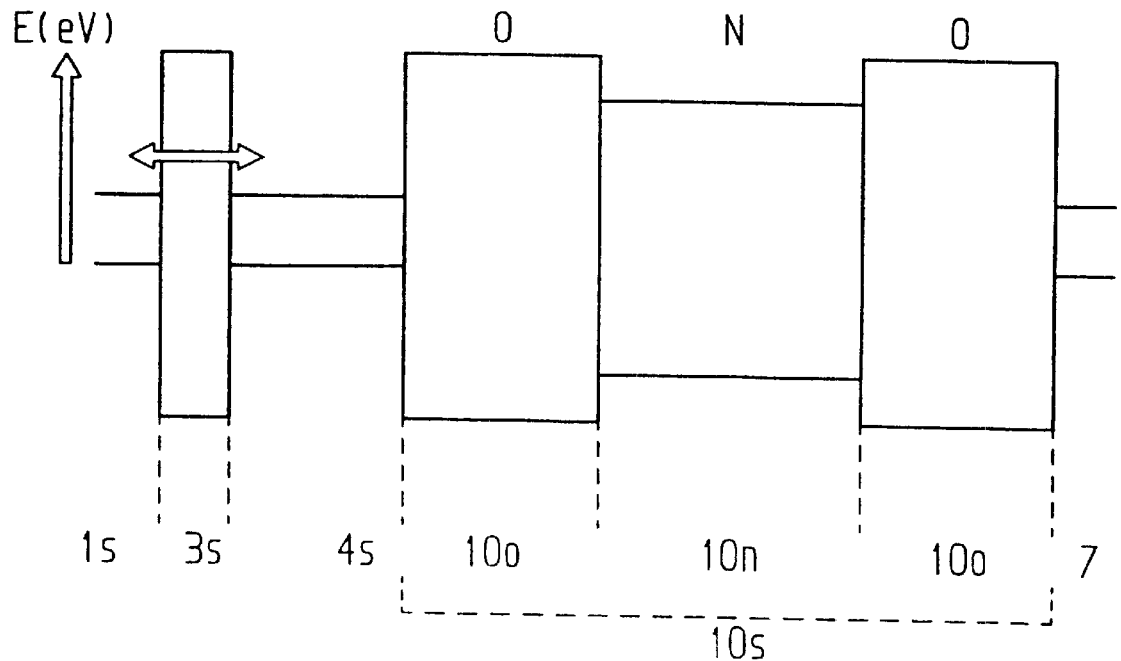
FIG. 7 is a band diagram of a prior art semiconductor memory cell.

FIG. 6 is a diagrammatic view of a band diagram of a fifth exemplary embodiment of the semiconductor memory cell. Reference numerals that are identical to those previously used denote layers that are identical or similar to those previously described, and consequently these layers are not described below.

The fifth exemplary embodiment of the semiconductor memory cell substantially corresponds to the semiconductor memory cell shown in FIG. 2, except that the $SiO_2$ layer 8 has been replaced by a nitrided $SiO_2$ layer 8c. A nitrided $SiO_2$ layer 8c of this type can be produced, for example, by depositing a silicon dioxide layer or by thermal oxidation. If this deposition or thermal oxidation is carried out in an atmosphere which additionally contains NO or $N_2O$ molecules, it is possible to produce the nitrided $SiO_2$ layer 8c. A nitrided $SiO_2$ layer of this type additionally prevents leakage currents and as a result improves the charge-storing behavior of the inventive semiconductor memory cell.

The production of the metal oxide layer 6 consisting of $WO_x$ and/or $TiO_2$, with its extremely high relative dielectric constant $\epsilon_r$, is described below.

Accordingly, when using $TiO_2$ as the metal oxide layer 6, the relative dielectric constant, which is important in connection with the coupling factor, is generated in the rutile phase by conditioning at approximately 900° C. This conditioning may take place during production of the titanium dioxide ($TiO_2$) layer or may only be carried out in a subsequent process step during the fabrication of an integrated circuit.

To form the $WO_x$ layer as the metal oxide layer 6 in the inventive semiconductor memory cell, it is possible, for example, to apply a tungsten-containing layer, a pure tungsten layer, a tungsten nitride layer, or a tungsten silicide layer, which is produced using a conventional sputtering process or a CVD (Chemical Vapor Deposition) method. After deposition of the tungsten-containing layer, this layer is transformed, in the same way as the Ti layer 5 shown in FIG. 1c, into a metal oxide layer 6, i.e. a tungsten oxide layer. The transformation takes place in an oxygen atmosphere (e.g. $O_2$ or $H_2O$) at a temperature of from 500° C. to 1200° C. When using a pure tungsten layer or a tungsten silicide layer, the temperature should not exceed approximately 600° C., i.e. a low thermal budget RTO (Rapid Thermal Oxidation) should be carried out. This prevents, for example, silicon from diffusing into the tungsten-containing layer and prevents oxidation of the tungsten-containing layer.

The thermal oxidation of the tungsten-containing layer leads to a tungsten oxide layer which has hardly any impurities and a relative dielectric constant $\epsilon_r$ of greater than 50. The layers and the process parameters are selected in such a way that the tungsten-containing layer is completely transformed into the tungsten oxide layer.

By means of a subsequent heat treatment at a temperature of approximately 550° C. to 1100° C. in an inert atmosphere, it is possible to produce a tungsten oxide layer ($WO_x$, where x=2 to 3) in a crystalline or sintered phase (e.g. phases with an orthorhombic or tetragonal symmetry). This heat treatment may take place directly after the production of the tungsten oxide layer ($WO_x$) or may only be carried out in a subsequent process step related to the fabrication of an integrated circuit.

Alternatively, the tungsten oxide layer may also be applied directly, which eliminates the need to deposit the tungsten-containing layer and to thermally oxidize this layer. In this case, the tungsten oxide layer is produced using a CVD method. For this purpose, tungsten fluoride and water in the gaseous state are fed as precursors onto the substrate surface:

$2WF_6 + 4H_2O \rightarrow (WOF_4) + WO_3 + (HF)$ or

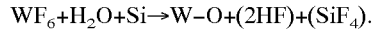
$WF_6 + H_2O + Si \rightarrow W-O + (2HF) + (SiF_4)$.

This leads to the deposition of a tungsten oxide layer that is approximately 2 to 20 nm thick.

Then, by means of a subsequent heat treatment at a temperature of approximately 550 to 1100° C., the tungsten oxide layer ($WO_x$, where x=2 to 3) is produced in a crystalline or sintered phase (e.g. orthorhombic or tetragonal symmetry) in the same way as that described above.

In particular the high thermal stability of $WO_x$ enables this material to be integrated particularly easily in the method shown in FIGS. 1a to 1f.

We claim:

1. A non-volatile semiconductor memory cell, comprising:
   a semiconductor substrate;
   an insulating tunnel oxide layer;
   a conductive floating-gate layer;
   an insulating dielectric layer including at least one metal oxide layer and at least one $Si_3N_4$ layer enclosing said metal oxide layer; and
   a conductive control-gate layer;
   said metal oxide layer being made of a material selected from the group consisting of $WO_x$, where x=2 to 3, and $TiO_2$.

2. The non-volatile semiconductor memory cell according to claim 1, wherein said floating-gate layer includes a poly-Si layer.

3. The non-volatile semiconductor memory cell according to claim 2, wherein said floating-gate layer includes a layer selected from the group consisting of a TiN layer and a WN layer.

4. The non-volatile semiconductor memory cell according to claim 1, wherein said floating-gate layer includes a layer selected from the group consisting of a TiN layer and a WN layer.

5. The non-volatile semiconductor memory cell according to claim 1, wherein said dielectric layer has a thickness that is greater than 15 nm.

6. The non-volatile semiconductor memory cell according to claim 1, wherein said floating-gate layer has a thickness in a range from 5 nm to 50 nm.

7. A method for fabricating a non-volatile semiconductor memory cell, which comprises:
   a) forming active regions in a semiconductor substrate;

b) forming a tunnel oxide layer;

c) depositing a floating-gate layer;

d) depositing a metal-containing layer that includes a material selected from the group consisting of a metal and a metal compound;

e) etching the metal-containing layer and the floating-gate layer;

f) oxidizing the metal-containing layer and exposed side regions of the floating-gate layer to form a dielectric layer;

g) depositing a control-gate layer; and h) etching the control-gate layer, the dielectric layer, and the floating-gate layer.

8. The method according to claim 7, which comprises:

in step c) depositing a TiN layer; and in step d) depositing a Ti layer.

9. The method according to claim 7, which comprises:

in step c) depositing a poly-Si layer; and in step d) depositing a $WO_x$ layer, where x=2 to 3.

10. The method according to claim 7, which comprises:

in steps c) and d) depositing a common tungsten-containing layer; and in step f) performing the oxidizing out until an oxidized partial layer of the tungsten-containing layer forms the dielectric layer and an unoxidized partial layer of the tungsten-containing layer forms the floating-gate layer.

11. The method according to claim 7, which comprises:

i) forming an insulating intermediate layer on the surface of the control-gate layer.

12. The method according to claim 11, which comprises:

in step c) depositing a TiN layer; and in step d) depositing a Ti layer.

13. The method according to claim 11, which comprises:

in step c) depositing a poly-Si layer; and in step d) depositing a $WO_x$ layer, where x=2 to 3.

14. The method according to claim 11, which comprises:

in steps c) and d) depositing a common tungsten-containing layer; and in step f) performing the oxidizing out until an oxidized partial layer of the tungsten-containing layer forms the dielectric layer and an unoxidized partial layer of the tungsten-containing layer forms the floating-gate layer.

* * * * *